United States Patent [19]

Biefeld et al.

[11] Patent Number: 5,065,205
[45] Date of Patent: Nov. 12, 1991

[54] LONG WAVELENGTH, HIGH GAIN INASSB STRAINED-LAYER SUPERLATTICE PHOTOCONDUCTIVE DETECTORS

[75] Inventors: Robert M. Biefeld; L. Ralph Dawson; Ian J. Fritz; Steven R. Kurtz; Thomas E. Zipperian, all of Albuquerque, N. Mex.

[73] Assignee: The United States of America as represented by the United States Department of Energy, Washington, D.C.

[21] Appl. No.: 350,814

[22] Filed: May 12, 1989

[51] Int. Cl.$^5$ .................. H01L 29/205; H01L 27/14; H01L 31/06
[52] U.S. Cl. .......................... 357/30; 357/4; 357/16
[58] Field of Search ................ 357/16, 30, 4

[56] References Cited

U.S. PATENT DOCUMENTS 4,607,272 8/1986 Osbourn .................... 357/30

FOREIGN PATENT DOCUMENTS 60-247979 12/1985 Japan ....................... 357/4
61-27686 2/1986 Japan ....................... 357/4

OTHER PUBLICATIONS

G. Osbourn, "InAsSb Strained-Layer Superlattices for Long Wavelength Detector Applications", *J. Vac. Sci. Technology B*, vol. 2, No. 2, Apr.-Jun. 1984, pp. 176-178.
S. Kurtz et al., "Extended Infrared Response of InAsSb Strained-Layer Superlattices", *Applied Physics Letters*, vol. 52, No. 10, Mar. 7, 1988, pp. 831-833.
S. Kurtz et al., "Demonstration of an InAsSb Strained-Layer Superlattice Photodiode", *Applied Physics Letters*, vol. 52, No. 19, May 9, 1988, pp. 1581-1583.
G. Dohler, "Doping Superlattices (n-i-p-i Crystals)", *IEEE Journal of Quantum Electronics*, vol. QE-22, No. 9, 09/86, pp. 1682-1694.
R. Biefeld et al., "Strain Relief in Compositionally Graded InAsx-Sb1-x Buffer Layers and InAsxSb1-x/InSb Strained-Layer Superlattices Grown by MOCVD", Jour. of Crystal Growth, vol. 91, 1988, pp. 515-516.
Rittner, *Photoconductivity Conference*, Wiley, New York, 1956, pp. 233-237.
P. Kruse, *Semiconductors and Semimetals*, vol. 5, Academic Press, New York, 1970.
S. Kurtz et al., "InAsSb Strained-Layer Superlattices: A New Class of Far Infrared Materials", *SPIE*, vol. 930, Infrared Detectors and Arrays, 1988, pp. 101-113.

*Primary Examiner*—Jerome Jackson, Jr.
*Attorney, Agent, or Firm*—Karla Ojanen; James H. Chafin; William R. Moser

[57] ABSTRACT

A high gain photoconductive device for 8 to 12 μm wavelength radiation including an active semiconductor region extending from a substrate to an exposed face, the region comprising a strained-layer superlattice of alternating layers of two different $InAs_{1-x}Sb_x$ compounds having $x > 0.75$. A pair of spaced electrodes are provided on the exposed face, and changes in 8 to 12 μm radiation on the exposed face cause a large photoconductive gain between the spaced electrodes.

8 Claims, 4 Drawing Sheets

LONG WAVELENGTH, HIGH GAIN INASSB STRAINED-LAYER SUPERLATTICE PHOTOCONDUCTIVE DETECTORS

The United States Government has rights in this invention pursuant to Contract No. DE-AC04-76DP00789 between the Department of Energy and AT&T Technologies, Inc.

BACKGROUND OF THE INVENTION

Presently, HgCdTe based devices constitute state-of-the-art technology for 8-12 $\mu$m detector applications. However, HgCdTe has metallurgical, mechanical and processing problems which limit its application. For example, the material is mechanically brittle, the dopant concentration in HgCdTe is hard to control, it may have long term stability problems, and its electrical properties may be unsatisfactory for 8-12 $\mu$m photovoltaic array applications. In addition, the radiation hardness of these devices is quite low.

III-V semiconductor based detectors should be superior to II-VI detectors such as HgCdTe in all of the above mentioned areas. U.S. Pat. No. 4,607,272 of G. Osbourn discloses that the spectral response of HgCdTe devices may be attained with III-V, InAsSb strained-layer superlattices (SLSs). The patent discloses an $InAs_{1-x}Sb_x/InAs_{1-y}Sb_y$ SLS electro-optical device with $0.5 < x < 0.7$ and $x < y$. No mention was made of a high gain photoconductive device because such knowledge of the properties of these materials was not available at the time of the earlier patent. The patent also did not recognize the presence of a type II superlattice.

Other work indicative of prior art includes the observation by G. Dohler, "Doping Superlattices (,n-i-p-i Crystals,)", IEEE Journal of Quantum Electronics, Vol. QE-22, No. 9, September 1986, pp. 1682-1694, of large photoconductive gains in a type II, doping superlattice, short wavelength, GaAs "selective contact" detector. In addition, S. Kurtz et al., "Extended infrared response of InAsSb strained-layer superlattices", Appl. Phys. Lett. 52(10), Mar. 7, 1988, pp. 831-833, discloses that a type-II superlattice occurs in $InAs_{1-x}Sb_x$ for $x > 0.6$.

SUMMARY OF THE INVENTION

It is an object of this invention to provide an 8-12 $\mu$m, InAsSb SLS photoconductive device.

It is another object of this invention to provide a 4-layer InAsSb SLS photoconductive device.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purpose of the present invention, as embodied and broadly described herein, the present invention may comprise a photoconductive detector for 8 to 12 $\mu$m wavelength radiation including a substrate and an active semiconductor region extending from the substrate to an exposed face, the region comprising a strained-layer superlattice of alternating layers of two different $InAs_{1-x}Sb_x$ compounds having $x > = 0.75$. A pair of spaced electrodes are provided on the exposed face, and changes in 8 to 12 $\mu$m radiation flux on the exposed face causes a large change in resistance between the spaced electrodes when biased.

BRIEF DESCRIPTION OF THE DRAWINGS

The accompanying drawings, which are incorporated in and form part of the specification, illustrate an embodiment of the present invention and, together with the description, serve to explain the principles of the invention.

DETAILED DESCRIPTION OF THE INVENTION

InAsSb strained-layer superlattices (SLSs) are being developed to extend the photoresponse of III-V materials to longer wavelength for 8-12 $\mu$m detector applications. InAsSb SLSs have been shown to have type II band offsets, and a sensitive InAsSb SLS photodiode was constructed, demonstrating that some of the difficulties resulting from photocarrier transport perpendicular to the SLS planes can be overcome in this system.

A potential advantage of a type II superlattice for detector applications is the suppression of recombination in these structures due to the spatial separation of electrons and holes. When a photocarrier's lifetime exceeds the sample transit time, a large photoconductive gain can result. An example of suppressed recombination has been reported in type II, doping superlattices, where enormous photoconductive response times have been observed. This invention discloses photoconductive InAsSb SLS detectors with large photoconductive gain at long wavelength response.

Figure 1:
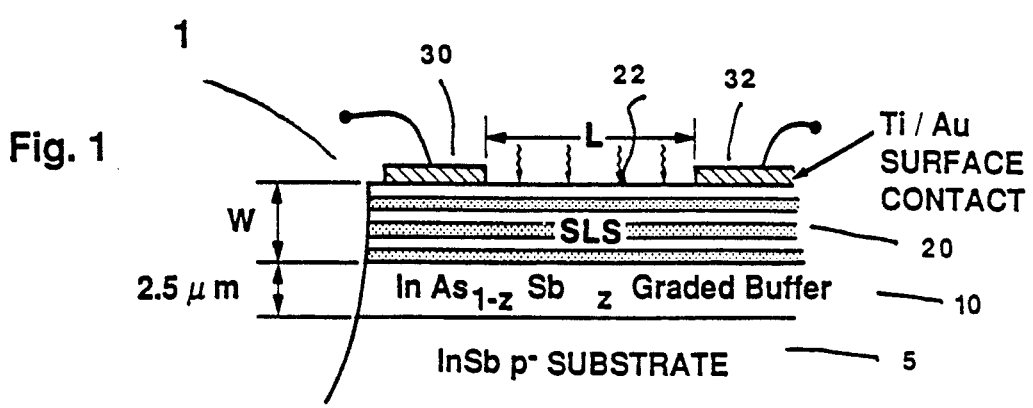
FIG. 1 shows a sectional view of an InAsSb SLS photoconductive detector.

FIG. 1 shows a photoconductive device 1 in accordance with a preferred embodiment of this invention to include an p— InSb substrate 5, a composition-graded strain-relief $InAs_{1-z}Sb_z$ buffer 10, and an SLS region 20 having an exposed face 22. Spaced contacts 30, 32 on exposed face 22 connect device 1 to an external electrical surface. The conductivity of device 1 between contacts 30, 32 is dependent upon the amount of radiation impinging exposed surface 22 between the contacts.

There are two different embodiments of SLS region 20: a 2-layer and a 4-layer structure. The 2-layer SLS consists of alternating layers of $InAs_{1-x}Sb_x$, where x1 and $x2 > = 75$, and $x1 \neq x2$. The 4-layer SLS consists of unstressed $InAs_{1-x}Sb_x$ spacer layers between each adjacent strained layer, the unstrained layers serving to further reduce electron-hole recombination. It is understood by those skilled in this art that SLS structure may exist only if the thickness of each layer is sufficiently thin and the difference between lattice constants of the alternating layers (a function of x) is sufficiently small. The unstrained layers in the 4-layer structure have a lattice constant approximately midvalue between the lattice constants of the strained layers.

The SLS region 20 may be grown using known techniques such as metal-organic chemical vapor deposition or molecular beam epitaxy. From photoluminescence linewidths and other characterization techniques, SLSs with these compositions have been shown to be relatively free of dislocations and microcracks. Contacts 30, 32 are formed by depositing Ti (300 Angstroms)/ Au (4000 Angstroms) surface contacts on the SLS.

Although InAsSb can form a type-II superlattice with a percentage of antimony in one layer greater than 60%, growth of a "defect free" SLS on InSb for use as a photoconductor in the 8-12 μm range limits the lowest percentage of antimony to be $>=75\%$.

FIGS. 2-5 show test results for a 2-layer and a 4-layer device built in accordance with this invention. The 2-layer SLS had alternating layers with values of x of 0.89/1.00. (InAsSb with x=1 is InSb). The thickness of each layer was 210 Angstroms, and the thickness W of region 5 was 2 μm. The 4-layer SLS had alternating layers with values of x of 0.89/0.93/0.89/0.93. This SLS had equal 185 Angstrom thick layers with W=4.0 μm.

Figure 2A:
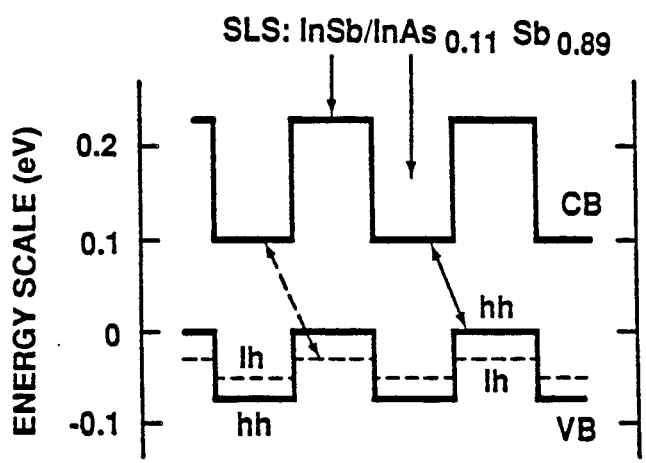
FIGS. 2a and 2b show band structure and composition of a 2-layer and 4-layer SLS, respectively.
Figure 2B:
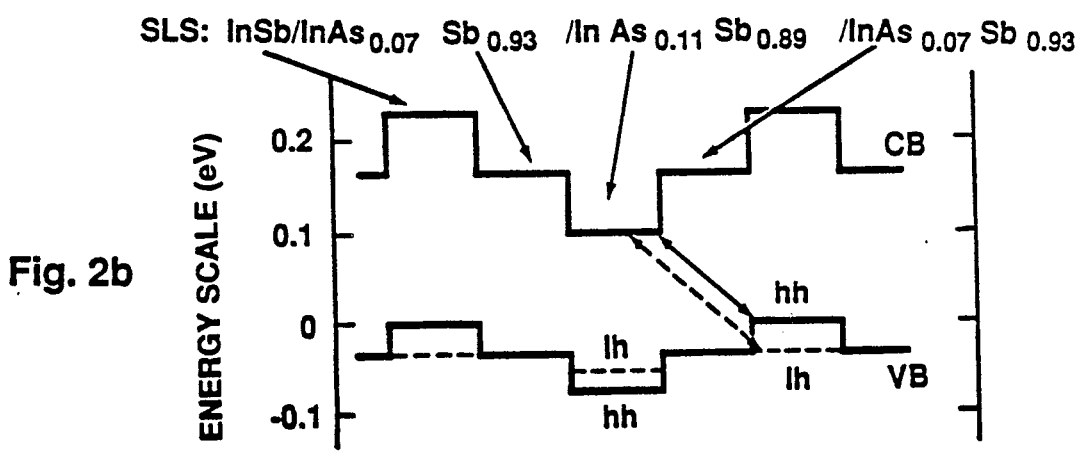

Based on previous optical characterization studies, the quantum-well structures of these SLSs at 77° K are shown in FIGS. 2a and 2b. The spatially indirect, lowest energy, out-of-plane electon-heavy hole (e-hh) and electron-light hole (e-lh) transitions are indicated by the solid and dotted arrows, respectively. These curves are characteristic of band offsets of type II SLS. In a type I material, the electron and hole potential wells occur in the same layer, and the lowest potential energy optical transition is the strain-shifted bandgap of the $InAs_{1-x}Sb_x$ layer. However, the type II offsets of the SLS of this invention have electron and hole potential wells in different layers.

Figure 3A:
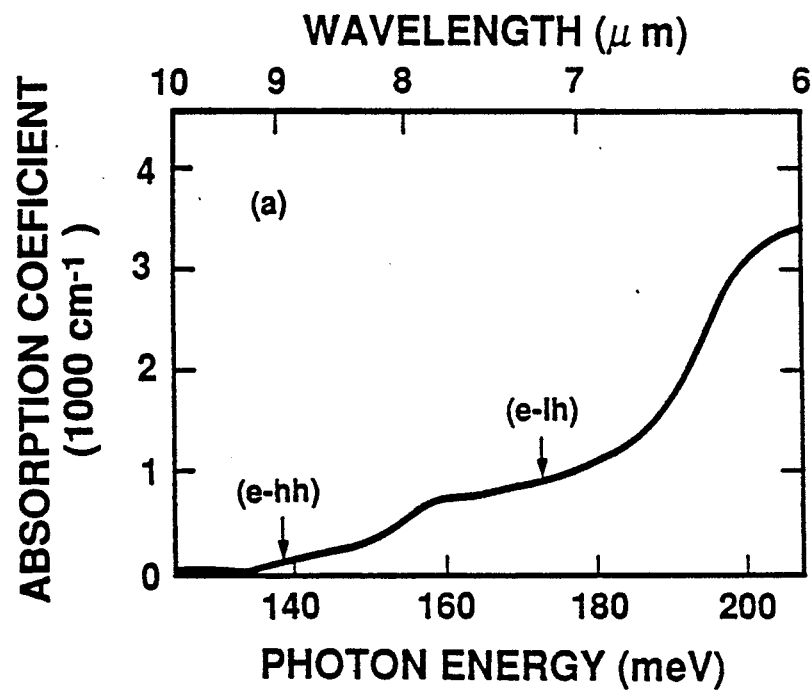
FIGS. 3a and 3b show bulk infrared absorption spectra of a 2-layer and 4-layer SLS, respectively.
Figure 3B:
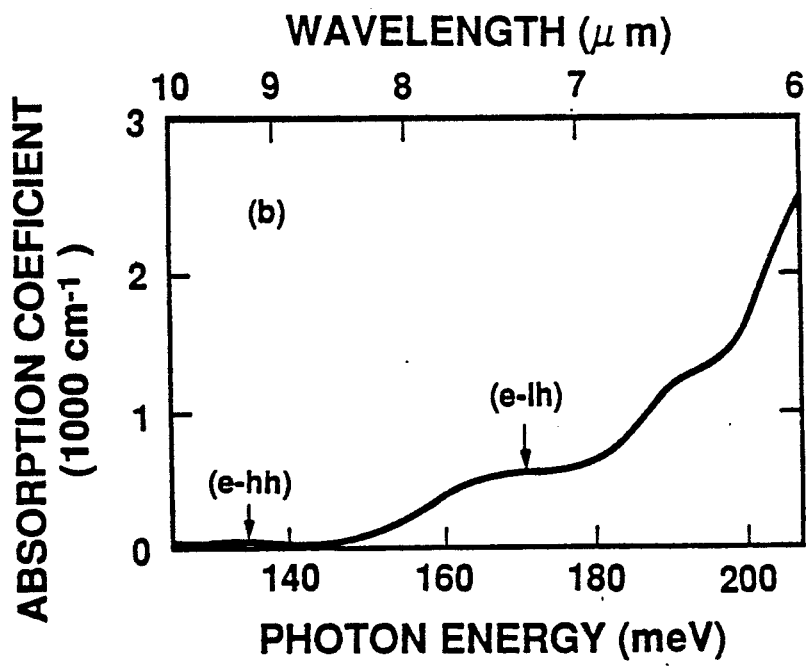

The effect of the spacer layers is easily observed by comparing the infrared absorption spectra of these two SLSs in FIG. 3. Buffer and substrate absorption have been subtracted from these spectra. Including quantum size effects, the predicted onsets of the (e-hh) and (e-lh) transitions are indicated by the arrows in each spectrum. For the 2-layer SLS of FIG. 3a, the longest wavelength (e-hh) absorption is observed. However, in the 4-layer SLS of FIG. 3b, the longest wavelength (e-hh) transitions are suppressed, and absorption is first observable at approximately 20 meV higher energy. The strong (e-lh) transitions in both SLSs are comparable in energy and intensity except for a difference in the magnitude of the absorption coefficients due to the difference in the SLS period.

Four-point measurements at 77° K indicate that these devices have a large contact resistance, and therefore, the device resistance was not proportional to the length to the gap, L. Even with this contact resistance, all devices were ohmic for less than 0.5 V bias. Consistent with operation of these detectors in a photoconductive mode, the responsivity of a device increased with bias and was proportional to the dark current (e.g., the observed current of the biased detector when not exposed to light), even in the non-ohmic region of the I-V characteristic. No photoresponse was observed at zero bias. Furthermore, the shape of the spectral response was independent of bias voltage. Hall measurements indicate background SLS doping of $10^{16}$/cm, p-type.

Figure 4A:
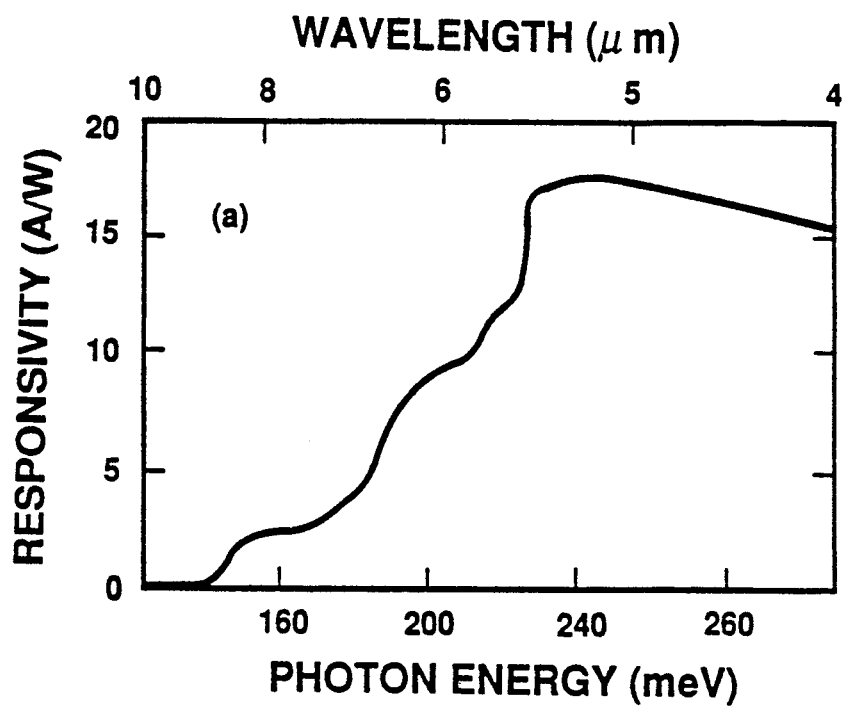
FIGS. 4a and 4b show external current responsivity of the 2-layer and 4-layer SLS detectors, respectively.
Figure 4B:
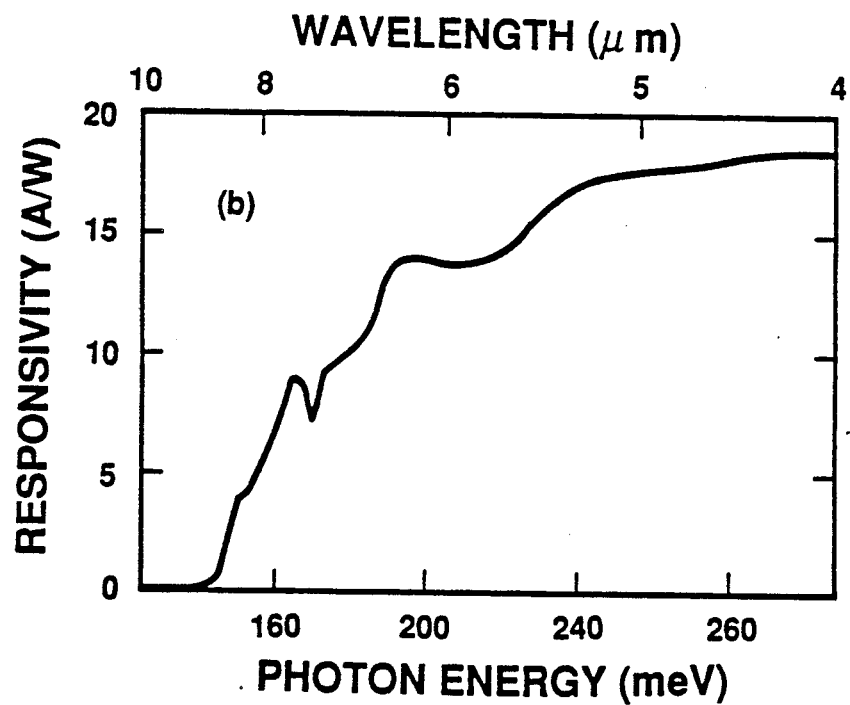
Figure 5A:
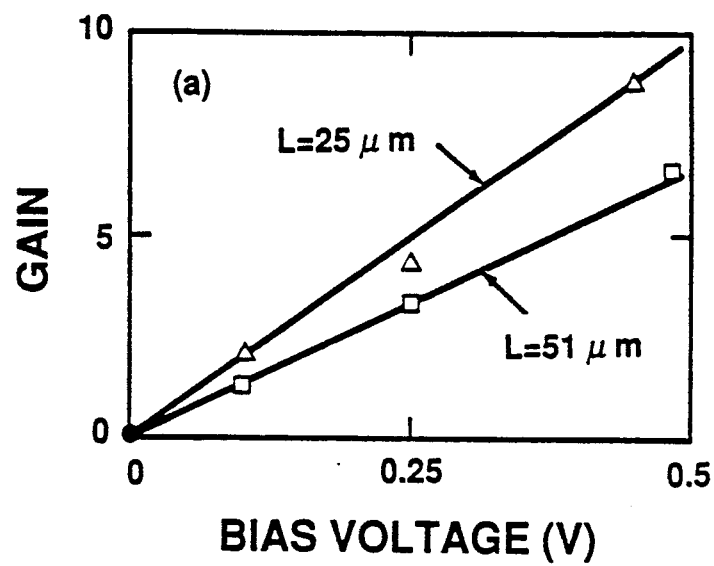
FIGS. 5a and 5b show measured photoconductive gain for the 2-layer and 4-layer SLS detectors, respectively.
Figure 5B:
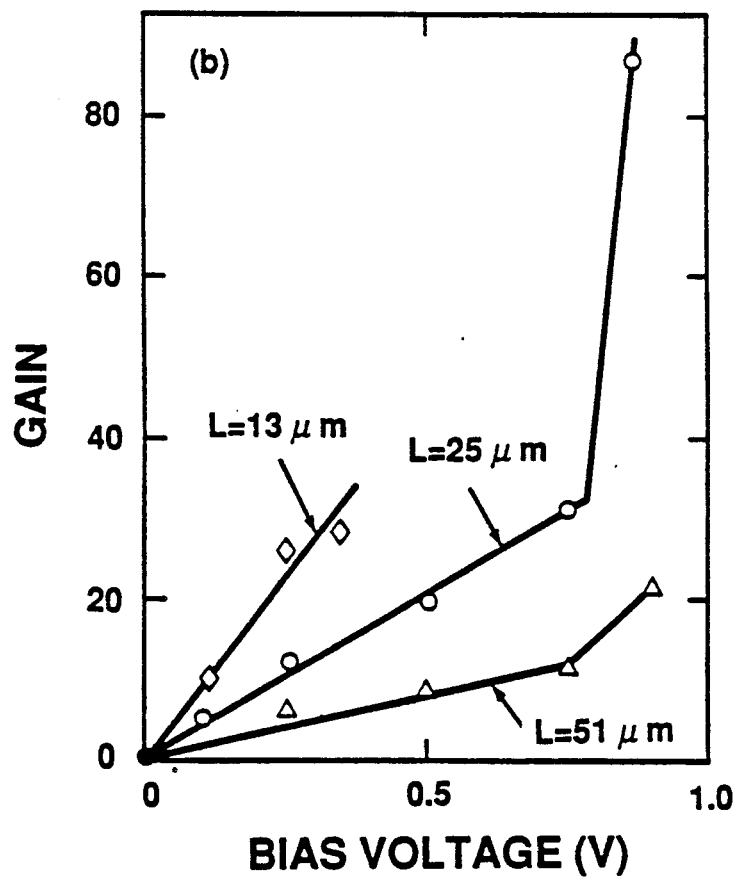

The responsivities of the SLS detectors were measured using a Fourier transform spectrometer and a calibrated HgCdTe detector as a reference. The external, current responsivities obtained for the two SLSs with 0.25 V bias and L=25 microns, are shown in FIG. 4. The spectral responsivity of the detector with the 2-layer SLS (FIG. 4a) corresponds to the SLS absorption spectrum of FIG. 3a. However, the spectral responsivity of the 4-layer detector (FIG. 4b) is enhanced at long wavelength, and it appears a higher photoconductive gain is associated with the (e-hh) transitions in the 4-layer structure. We speculate that the gain is lower for the (e-lh) transitions of the 4-layer SLS, compared to its (e-hh) transitions, due to inefficient capture of the holes in the heavy hole quantum well.

The external, current responsivity, in amperes per watt for a photoconductor is given by the following equation:

$$R = e(1-r)(nG)/(hv)$$

where r is the reflectivity (36%), hv is the photon energy, n is the quantum efficiency, and G is the photoconductive gain. For a thin, weakly absorbing SLS, m=aW, where a is the measured absorption coefficient in FIG. 3. Using these definitions, the photoconductive gain for both SLSs, at 161 meV at a wavelength 7.7 μm, is plotted in FIG. 5 for a variety of bias voltages, V, and electrode gaps. As pointed out earlier, gain G is proportional to bias V in the ohmic region, and it is significantly larger in the 4-layer SLS at this energy. Also, for both devices, gain G is inversely proportional to gap length L at constant bias voltage. A large contact resistance will produce this deviation from the usual relation of G being inversely proportional to the square of L observed at constant voltage. Note that photoconductive gains as high as 90 are demonstrated for the 4-layer device, and even larger gains can be obtained with higher bias voltages producing dark currents greater than 2 mA.

In an attempt to decrease the contact resistance and increase the electric field in the photoconductive region, another detector was made with p+ contacts diffused into the 4-layer SLS. The gain of this device decreased by more than an order of magnitude from the values shown in FIG. 4(b). This performance indicates the surface contacts are preventing minority carrier sweepout due to either transport perpendicular to the superlattice layers or a blocking contact. The gains shown in FIG. 5 greatly exceed the maximum gain that can be obtained with minority carrier sweepout in these SLSs, $(1+u_h/u_e)/2$ approximately equal 1, where $u_h$ and $u_e$ are the in-plane hole and electron mobilities, respectively.

The photoconductive response time of these devices was measured in a pulsed photoconductivity experiment using a Nd:YAG laser (1.06 μm) with 200 psec pulse width. The photocurrent decayed exponentially after pulsed excitation. Characteristic of photocarrier lifetime limited gain, without sweepout, the decay times were independent of bias voltage and device length for detectors with surface contacts. The measured decay times for the 2-layer and 4-layer detectors at 77° K were 20 nsec and 80 nsec respectively. Because this wavelength is strongly absorbed, these measured lifetimes may be limited by surface recombination, and the photoconductive lifetimes in the bulk of the SLS could be even longer. Consistent with the high gains reported for these devices, the photoconductive lifetimes in the SLSs appear larger than those in bulk InSb. Photoconductive decay times in the range of 10-30 nsec were observed in the 4-layer detector with contacts diffused into the SLS, and the decay time decreased with increased bias voltage. Once more, this behavior suggests that minority carrier sweepout can occur in devices with diffused contacts.

The particular sizes and equipment discussed above are cited merely to illustrate a particular embodiment of this invention. It is contemplated that the use of the invention may involve components having different sizes and shapes as long as the principle, using InAsSb SLSs to build photoconductive detectors with both high gain and long wavelength photoresponse, is followed. It is intended that the scope of the invention be defined by the claims appended hereto.

We claim:

1. A photoconductive detector for 8 to 12 $\mu$m wavelength radiation comprising:
    a substrate;
    an optically active semiconductor region extending from said substrate to an exposed face, said region comprising a strained-layer superlattice having a repeating unit comprised of an unstressed $InAs_{1-x}Sb_x$ spacer layer between two stressed layers, each of said stressed layers being a $InAs_{1-x}Sb_x$ compound with $x \geq 0.75$ and compositionally different than any other layer in said repeating unit, and said layers separating positively charged photocarriers from negatively charged photocarriers; and
    at least two electrodes contacting said exposed face wherein a number of available photocarriers between said electrodes increases responsive to 8 to 12 $\mu$m radiation impinging on said exposed face, said increase in available photocarriers resulting in increased photoconductive gain when the device is biased.

2. The photoconductive detector of claim 1 wherein $x = 1$ for one of said layers.

3. The photoconductive device of claim 1 wherein said substrate is p− InSb.

4. The photoconductive device of claim 3 wherein said active semiconductor region further comprises an $InAs_{1-z}Sb_z$ graded buffer between said substrate and said strained-layer superlattice.

5. The photoconductive device of claim 1 wherein the lattice constant of said spacer layer is approximately midvalue between the different lattice constants of said two stressed layers.

6. A photoconductive detector for 8 to 12 $\mu$m wavelength radiation comprising:
    a substrate;
    a graded buffer region composed of $InAs_{1-x}Sb_x$ covering said substrate;
    an optically active semiconductor region extending from said graded buffer region to an exposed face, said region comprising a strained-layer superlattice having a repeating unit of a first, a second and a third layer, said second layer positioned between said first and third layers, each of said layers being a $InAs_{1-x}Sb_x$ compound with x greater than or equal to 0.75 and each of said layers compositionally different from any other layer in said repeating unit, the lattice constant of said second layer is approximately midvalue between the lattice constants of said first and third layers, resulting in a separation of positively charged photocarriers from negatively charged photocarriers; and
    at least two electrodes contacting said exposed face wherein a number of available photocarriers between said electrodes increases responsive to 8 to 12 $\mu$m radiation inpinging on said exposed face, said increase in available photocarriers resulting in increased photoconductive gain.

7. A photoconductive detector for 8 to 12 $\mu$m wavelength radiation comprising:
    a substrate;
    an active semiconductor region extending from said substrate to an exposed face, said region comprising a strained-layer superlattice of alternating layers of two different $InAs_{1-x}Sb_x$ compounds having $x$ greater than or equal to 0.75, and further comprising an unstressed $InAs_{1-y}Sb_y$ spacer layer between each strained layer; and
    a pair of spaced electrodes contacting said exposed face;
    wherein changes in 8 to 12 $\mu$m radiation on said exposed face cause a large change in resistance between said spaced electrodes when the device is biased.

8. The photoconductive device of claim 7 wherein the lattice constant of said spacer layer is approximately midvalue between the different lattice constants of said first and second layers.

* * * * *